(12) United States Patent
Yamaguchi

(10) Patent No.: US 6,762,433 B2
(45) Date of Patent: Jul. 13, 2004

(54) SEMICONDUCTOR PRODUCT WAFER HAVING VERTICALLY AND HORIZONTALLY ARRANGED PATTERNED AREAS INCLUDING A LIMITED NUMBER OF TEST ELEMENT GROUP REGIONS

(75) Inventor: Takahisa Yamaguchi, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/246,717

(22) Filed: Sep. 19, 2002

(65) Prior Publication Data

US 2003/0017631 A1 Jan. 23, 2003

Related U.S. Application Data

(62) Division of application No. 09/696,196, filed on Oct. 26, 2000, now Pat. No. 6,492,189.

(30) Foreign Application Priority Data

Nov. 9, 1999 (JP) ............................................. 11-318330

(51) Int. Cl.⁷ ............................................. H01L 23/544

(52) U.S. Cl. ........................... 257/48; 257/620; 438/11; 438/14

(58) Field of Search ........................... 257/48, 734, 786, 257/620–621; 438/18, 631, 14

(56) References Cited

U.S. PATENT DOCUMENTS 6,314,543 B1 * 11/2001 Yamaguchi .................... 716/1

FOREIGN PATENT DOCUMENTS

| JP | 5-291106 | 11/1993 |
|---|---|---|
| JP | 10-312049 | 11/1998 |

* cited by examiner

*Primary Examiner*—Dung A. Le
(74) *Attorney, Agent, or Firm*—Oliff & Berridge, PLC

(57) ABSTRACT

A plurality of patterned areas is arranged vertically and horizontally with fixed pitches on a surface of a semiconductor product wafer. The patterned areas include a plurality of first patterned areas and at least one second patterned area. The first patterned area includes a device region, and the second patterned area includes a portion of the device region and a Test Element Group (TEG) region.

4 Claims, 7 Drawing Sheets

PROJECTION OF PORTION OF DEVICE CHIP PATTERN 12
14
10

42
44
FORMATION OF DEFECTIVE PATTERN IS PREVENTED
43

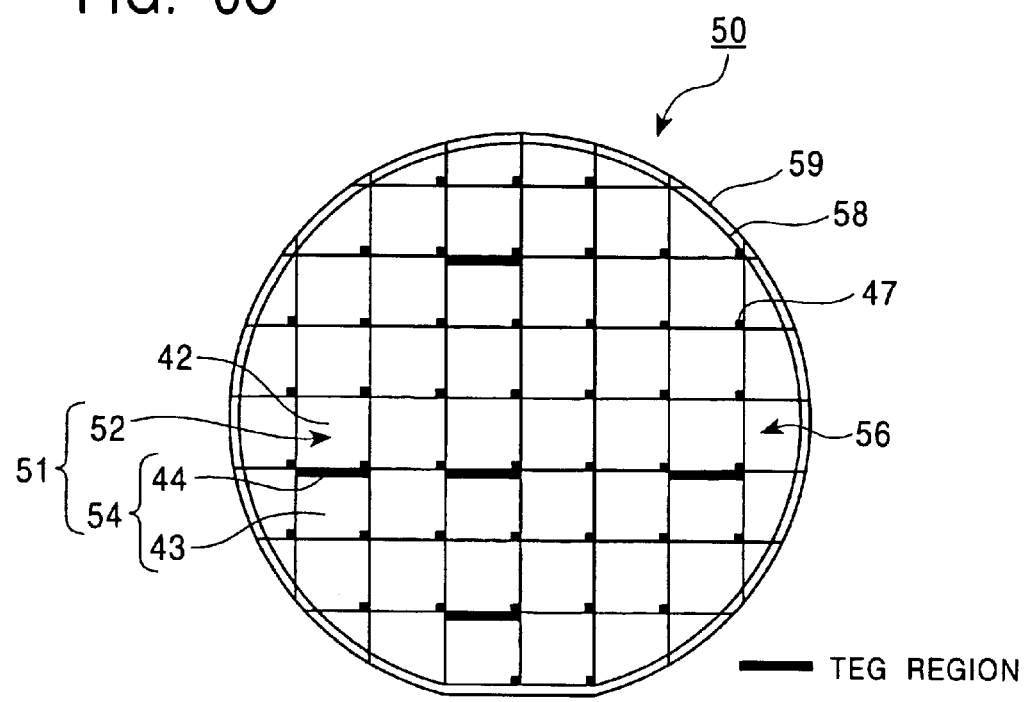

— TEG REGION

— TEG REGION

SEMICONDUCTOR PRODUCT WAFER HAVING VERTICALLY AND HORIZONTALLY ARRANGED PATTERNED AREAS INCLUDING A LIMITED NUMBER OF TEST ELEMENT GROUP REGIONS

This application is a division of Ser. No. 09/696,196 filed on Oct. 26, 2000, now U.S. Pat. No. 6,492,189.

BACKGROUND OF THE INVENTION

1. Field of Invention

This invention relates to a mask exposure method used in the production of semiconductor devices. This invention also relates to a reticle mask used in the method. This invention further relates to a semiconductor product wafer produced by the method. This invention also relates to a method of producing semiconductor device chips.

2. Description of Related Art

Semiconductor devices, such as semiconductor integrated circuits, are generally produced by repeatedly exposing a semiconductor wafer through a mask pattern on a reticle using an exposing apparatus, such as a stepper, thereby forming a plurality of exposed areas arranged on the entire surface of the semiconductor wafer. The image of the mask pattern is printed on a resist layer applied on the surface of the semiconductor wafer, and developed to form a resist pattern, which is used as a mask for, for example, etching a layer formed on the surface of the wafer. By repeating these processes, a plurality of semiconductor device chips is produced on entire surface of the wafer. The semiconductor devices chips are separated into individual semiconductor devices at scribe lines between the chips and encapsulated into packages.

Typically, a reduction-type exposing apparatus is used to expose semiconductor wafers. Therefore, the size of the mask patterns on the reticle is several times the size of the actual semiconductor device patterns formed on the semiconductor wafer.

In addition to these actual devices, test devices for measuring electrical characteristics are also formed on semiconductor wafers. These test devices are called test element groups (TEGs) and are formed, for example, in the scribe lines.

Japanese Unexamined Patent Application Publication Nos. 5-291106 and 10-312049 disclose exposure processes of chip patterns. In these processes, a semiconductor chip pattern (LSI pattern) and a TEG pattern are arranged on the same reticle. Required positions of the wafer are exposed through the TEG pattern and the other positions are exposed through the chip pattern. To expose through the TEG pattern, mask blinds of the stepper cover the chip pattern on the reticle so that only the TEG pattern is projected onto the wafer. The TEG pattern is covered to expose through the chip pattern.

A serious concern in semiconductor production is to increase the number of semiconductor device chips produced on one semiconductor wafer. A countermeasure is narrowing the scribe lines. This method is particularly effective in producing semiconductor devices with small chip dimensions, such as 1 mm×1 mm. A plurality of mask patterns for such small semiconductor device chips are closely arranged with narrow scribe lines of, for example, 50 $\mu$m (the width when exposed on the wafer) on the same reticle so that the size of the entire mask pattern substantially corresponds to a field size, for example, 20 mm×20 mm that can be exposed at once by the exposing apparatus. The number of the chips formed by an exposure step and the total number of the chips formed on the entire wafer can be increased. Because the TEG patterns and alignment marks for the exposing apparatus cannot be included within the width of such narrow scribe lines, regions corresponding to one to several semiconductor chips on the mask pattern are allocated to the TEG patterns and the alignment marks.

When the above exposure step, however, is repeated over the entire surface of the semiconductor wafer, a plurality of exposed areas, each composed of a device region including a plurality of semiconductor device chips and a TEG region, is formed on the semiconductor wafer. In order to increase the number of the device chips produced on one wafer, it is preferable that the number of the TEG regions on one wafer be minimized as much as possible, for example, to one to several, by producing the TEG regions in only specific positions.

In the above-described process using the mask blinds, however, the step pitch in the exposed areas arranged on the wafer surface cannot be maintained constant, when the device region and the TEG region have different sizes.

Thus, the distances between alignment marks for use in a laser-trimming step, each provided at a specific position in each device region, are different. Therefore, the laser-trimming step requires complicated treatment, such as combining a plurality of map layouts, or splitting in a plurality of steps on each wafer. Moreover, 5 to 10% of the chips on the periphery of the wafer cannot be treated depending on the laser-trimming apparatuses. A process for measuring electrical characteristics is also complicated due to the irregular distances between the TEG regions.

SUMMARY OF THE INVENTION

Accordingly, it is an object of this invention to provide an exposure method capable of arranging exposed areas with fixed pitches even when TEG regions are formed only at several positions on a semiconductor wafer.

It is another object of this invention to provide a reticle mask used in the exposing method.

According to one aspect of this invention, an exemplary method of fabricating semiconductor devices comprises: applying a resist layer on a surface of a semiconductor wafer; forming a plurality of exposed areas in the resist layer arranged in rows and columns with fixed pitches, the exposed areas including a plurality of first exposed areas each including a device region, and at least one second exposed area including a portion of the device region and a TEG region.

Preferably, the device region of the first exposed areas includes a predetermined number of rows of exposed device chip patterns and the portion of the device region of the second exposed area includes a number of rows of the exposed device chip patterns that is less than the predetermined number of rows.

Preferably, each of the first exposed regions is formed by a single exposure.

Preferably, the first and the second exposed areas are formed using a common reticle having a device pattern region to form the device region and a having TEG pattern region to form the TEG region.

Preferably, the second exposed area is formed by a first exposure of the resist layer through a portion of the device pattern region and by a second exposure of the resist layer through the TEG pattern region of the common reticle.

Preferably, the TEG pattern region of the common reticle includes a blank zone, and a defective pattern formed by the first exposure is erased by the second exposure through the blank zone, or the second exposure through the blank zone prevents formation of a defective pattern by the first exposure.

Preferably, at least one of the first exposed areas is formed by exposing the resist layer through both the device pattern region and the TEG region of the common reticle so that the TEG region of the second exposed area adjacent to the at least one of the first exposed areas is formed simultaneously.

According to another aspect of this invention, an exemplary method of fabricating semiconductor devices comprises: setting a reticle having a device pattern region and a TEG pattern region in an exposing apparatus; positioning a semiconductor wafer having a resist layer on the semiconductor wafer in the exposing apparatus; and forming an exposed area in the resist layer by a first exposure through a portion of the device pattern region of the reticle and by a second exposure through the TEG pattern region of the reticle, wherein a defective pattern formed by the first exposure is erased by the second exposure, or the second exposure prevents formation of a defective pattern by the first exposure.

Preferably, the TEG pattern region of the reticle includes a blank zone and the second exposure though the blank zone erases or prevents the formation of the defective pattern.

Preferably, the device pattern region of the reticle includes a predetermined number of rows of device chip patterns and the portion of the device pattern region includes a number of rows of the device chip patterns that is less than the predetermined number of rows and a portion of an adjacent row of the device chip patterns.

According to another aspect of this invention, an exemplary reticle for use in an exposing apparatus comprises: a rectangular pattern forming area on a surface of a substrate, the pattern forming area having a side; and a device pattern region and a TEG pattern region arranged within the pattern forming area along a first direction perpendicular to the side of the pattern forming area, wherein the TEG pattern region includes a blank zone extending along a substantial length of the side of the pattern forming area.

Preferably, the TEG pattern region further includes a blind zone extending along a substantial length of a boundary between the device pattern region and the TEG pattern region in parallel with the side of the pattern forming area Preferably, the device pattern region includes a plurality of rows of device chip patterns for producing semiconductor device chips. The rows of the device chip patterns are aligned in the first direction.

Preferably, a width of scribe lines between the rows of the device chip patterns is smaller than an alignment error of a mask blind of the exposing apparatus.

Preferably, a dimension of the blank zone along the first direction is at least twice of an alignment error of a mask blind of the exposing apparatus.

According to another aspect of this invention, an exemplary semiconductor product wafer comprises: a plurality of patterned areas arranged vertically and horizontally with fixed pitches on a surface of the wafer, the patterned areas including a plurality of first patterned areas each including a device region and at least one second patterned area including a portion of the device region and a TEG region.

Preferably, the device region in each of the first pattern areas includes a predetermined number of rows of device chips, and the portion of the device region of the second patterned area includes a number rows of the device chips that is less than the predetermined number of rows of the device chips.

Preferably, a width of a scribe line between the rows of the semiconductor device chips is the same as that of a scribe line between the TEG region and an adjacent one of the rows of the device chips in the second patterned area.

Preferably, the TEG region is smaller than the portion of the device region.

According to another aspect of this invention, an exemplary method of producing semiconductor device chips comprises: forming a plurality of patterned areas arranged vertically and horizontally with fixed pitches on a surface of a semiconductor wafer, the patterned areas including a plurality of first patterned areas each including a device region and at least one second patterned area including a portion of the device region and a TEG region, such that each of the device regions and the portion of the device region includes at least one device chip, and at least selected ones of the patterned areas include alignment marks at a fixed relative position within the respective patterned areas; and directing an energy beam onto selected ones of the device chips by using the alignment marks as positional references and trimming the selected ones of the device chips using the energy beam.

Preferably, the device region in each of the first patterned areas includes a predetermined number of rows of the device chips, and the portion of the device region of the second patterned area includes a number of rows of the device chips that is less than the predetermined number of rows of the device chips.

Preferably, the plurality of patterned areas includes at least our, incomplete patterned area on the periphery of the wafer that includes at least one device chip; and the directing directs the energy beam onto the device chip in the incomplete patterned area using the alignment marks in at least one of the first and the second patterned areas as the positional references.

Herein, a region of a mask pattern on a reticle for producing semiconductor device chips is referred to as a "device pattern region," and a region of a mask pattern for producing TEGs is referred to as a "TEG pattern region." An area on a semiconductor wafer exposed through the reticle is referred to an "exposed area." In the exposed area, a latent image corresponding to the mask pattern on the reticle is formed in a resist layer on the surface of the semiconductor wafer. The latent image is developed to form a resist pattern, which is used, for example, as a mask for etching. The exposed area includes a device region exposed through the device pattern region on the reticle and/or a TEG region exposed through the TEG pattern region on the reticle. In the exposing process of this invention, a plurality of exposed areas is arranged in rows and columns with fixed pitches in horizontal and vertical directions on the semiconductor wafer. Each exposed area may be formed by a single exposure step or a plurality of exposure steps.

As the simplest method for achieving a shot layout (arrangement of exposed areas) with constant step pitches, two separate reticles can be used. That is, a first reticle including a device pattern region is used to form first exposed areas including only the device regions. A second reticle including a device pattern region and a TEG pattern region and having the same dimension as that of the first reticle is used to form second exposed areas each including both the device region and the TEG region. This method, however, requires two reticles for each layer in production of the semiconductor devices. Many sets of these reticles must be prepared and exchanged frequently in the production of advanced semiconductor devices, resulting in high cost and low production efficiency.

It is, therefore, preferable that the device regions and the TEG regions be exposed using a common reticle including both a device pattern region having an arrangement of a plurality of semiconductor device chip mask patterns and a TEG pattern region. In this case, exposure must be performed, for example, using mask blinds of the exposing apparatus for covering undesired portions of the reticle. The accuracy of alignment of the mask blinds, however, is low, resulting in a positioning error. The positioning error distributes statistically. Typically, three-times of the standard deviation ($3\sigma$) of the positioning error is approximately 100 $\mu$m on the wafer. Therefore, the exposure method should accept an alignment error of the mask blinds of approximately 100 $\mu$m on the wafer.

When exposure is performed using only the device pattern region, a blind zone having an adequate width provided at a boundary between the device pattern region and the TEG pattern region absorbs the alignment error of the mask blind.

To form a second exposed area containing both the device region and the TEG region, a portion of the device pattern region on the reticle should be covered so that a total dimension of the second exposed area is equal to that of the first exposed area containing only the device region. Therefore, the mask blinds should be used to expose through only a portion of the device pattern region and the TEG region. However, when the exposure is performed by covering a portion of the device pattern region, a defective pattern in which only a portion of the device chip pattern is printed is formed on the semiconductor wafer due to an alignment error of the mask blind at the boundary between a region to be exposed and a region not to be exposed in the device pattern region.

A possible method to prevent the formation of such a defective pattern is providing a blind zone within the device pattern region. This method, however, requires a sufficiently wide scribe line at the boundary, resulting in a reduced number of semiconductor chips producible on one semiconductor wafer.

In a preferred embodiment, a reticle is used in which both a device pattern region and a TEG pattern region are included, and a blind zone and a blank zone are provided in the TEG pattern region. More specifically, the blind zone is provided at one side of the TEG pattern region on the device pattern region side, and the blank zone is provided at the other side of the TEG pattern region away from the device pattern region. The width of the blind zone and the width of the blank zone may be appropriately determined depending on the alignment accuracy of the mask blind.

Using this reticle, first exposure steps of exposing the resist layer through only the device pattern region, second exposure steps of exposing through both the device pattern region and the TEG pattern region, and third exposure steps of exposing through only a portion of the device pattern region are repeated in an appropriate combination. By these exposure steps, first exposed areas including only the device region and second exposed areas, each including both the portion of the device region and the TEG region and having the same dimension as the first exposed area, can be formed on the semiconductor wafer. Because the dimension of the first exposed area and that of the second exposed area are the same, arbitrary numbers of the first and the second exposed areas can be arranged on the surface of the semiconductor wafer in rows and columns with fixed vertical and horizontal pitches.

The light passing through the blank zone in the TEG pattern region in the subsequent second exposure step erases a defective pattern formed on the semiconductor wafer in the third exposure step. Alternatively, the light passing through the blank zone in the second exposure step prior to the third exposure step preliminarily exposes a region where, without the second exposure step, the defective pattern would be formed, and prevents the formation of the defective pattern in the third exposure step.

BRIEF DESCRIPTION OF THE DRAWINGS

FIGS. 6A, 6B and 6C are conceptual views of an embodiment of an exposure process in accordance with this invention;

DETAILED DESCRIPTION OF PREFERRED EMBODIMENTS

This invention was first disclosed in Japanese Patent Application No. JP 11-318330, hereby incorporated by reference.

An exposure process and a reticle in accordance with this invention will now be described in detail with reference to the attached drawings and the following preferred embodiments.

Figure 1:
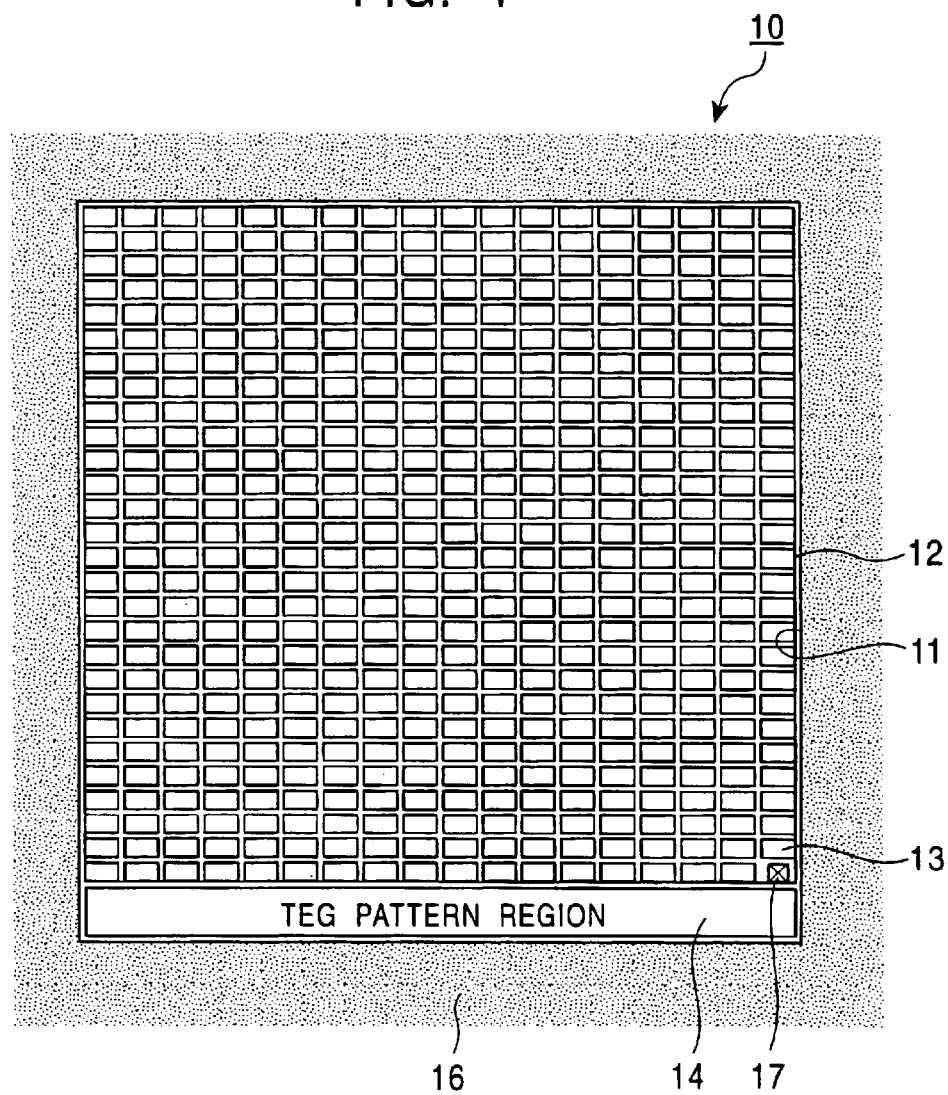
FIG. 1 is a conceptual view of an embodiment of a reticle for projection exposure in accordance with this invention.

FIG. 1 is a conceptual view of a reticle 10 as an embodiment in accordance with this invention. The reticle 10 includes a device pattern region 12 in which a plurality of mask patterns of semiconductor device chips is formed and a TEG pattern region 14 formed on one side (bottom side) of the device pattern region 12. For use in an exposing apparatus that utilizes an ultra-violet light source, mask patterns in the device pattern region 12 and the TEG pattern region 14 are formed with a chromium thin film on a surface of a glass substrate. A region surrounding the device pattern region 12 and the TEG pattern region 14 is blinded by, for example, a chromium thin film 16 on the surface of the substrate.

In other words, the reticle 10 has a pattern forming area 11 on the surface of the substrate surrounded by the chromium thin film 16. The TEG pattern region 14 is arranged along one side (bottom side) of the pattern forming area 11. The device pattern region 12 and the TEG pattern region 14 are arranged within the pattern forming area 11 along a vertical direction, i.e., a direction perpendicular to the bottom side of the pattern forming area 11.

In FIG. 1, the device pattern region 12 is conceptually represented by a rectangle. In this device pattern region 12 of the reticle 10, eighteen (18) columns and twenty eight (28) rows of the semiconductor device chip patterns 13 are arranged in the horizontal and vertical directions, respectively. That is, twenty-eight rows of the device chip patterns each including eighteen individual device chip patterns 13 are arranged in the vertical direction within the device pattern region 12. The width of scribe lines between the device chip patterns 13 is 50 $\mu$m (when printed on the wafer). An alignment mark pattern for laser trimming 17 is provided at the right-bottom corner of the device pattern region 12 using an area for one device chip pattern. Therefore, 18×28−1=503 device chip patterns 13 are included in the device pattern region 12. In this embodiment, the sizes of each semiconductor device chip in the horizontal and vertical directions are 1.000 mm and 0.650 mm, respectively, including the scribe line. Therefore, dimensions of the device pattern region 12 in the horizontal and the vertical directions are 1.00×18−0.05=17.95 mm and 0.65× 28−0.050=18.15 mm, respectively, excluding scribe lines surrounding the device pattern region 12.

The TEG pattern region 14 is also conceptually represented by a rectangle in FIG. 1. The TEG pattern retion 14 is provided for arranging patterns of TEGs and alignment marks for the exposing apparatus, which cannot be arranged in the scribe lines. The lateral dimension of the TEG pattern region 14 is the same as that of the device pattern region 12. That is, the length of the top and bottom sides of the TEG pattern region 14 is the same as the length of the top and bottom sided of the device pattern region 12. In this embodiment, the width (vertical dimension) of the TEG pattern region 14 corresponds to two rows of the semiconductor device chip patterns.

Figure 2:
FIG. 2 is a conceptual view of an embodiment of a TEG pattern region of the reticle.

FIG. 2 is a conceptual view of an embodiment of the TEG pattern region 14 arranged within the pattern forming region 11 of the reticle 10. The TEG pattern region 14 is provided with a shading strip (blind zone) 18 at the top side thereof and a transparent strip (blank zone) 20 at the bottom side thereof. Patterns of the TEGs and the alignment marks for the exposing apparatus are formed between the blind zone 18 and the blank zone 20.

The width (vertical dimension) of the blind zone 18 is 250 $\mu$m and the width of the blank zone 20 is 300 $\mu$m. Since the TEG pattern region 14 corresponds to two rows of the semiconductor device chip patterns 13, the width is 0.650 mm×2=1,300 $\mu$m including the width of the scribe line between the device pattern region 12 and the TEG pattern region 14. Thus, the TEG patterns and the alignment mark patterns are disposed within the width of 700 $\mu$m. These sizes are based on the pattern projected on the wafer.

Dimensions of the entire pattern region including the device pattern region 12 and the TEG pattern region 14 in the horizontal and vertical directions are 17.95 mm and 18.15+1.30=19.45 mm, respectively. And those of the pattern forming area 11 in the horizontal and vertical directions are 18.05 mm and 19.55 mm, respectively, including the width of the scribe line between the pattern regions 12, 14 and the surrounding chromium thin film 16.

The alignment accuracy of the mask blind is low, as described above, and the alignment error is approximately 100 $\mu$m when projected on the wafer. This is the error in one direction. Therefore, the width of the blind zone 18 and that of the blank zone 20 must be at least twice of the alignment error. Further, the positioning error of the mask blind distributes statistically as described above. Because the alignment error of 100 $\mu$m corresponds to three-times of the standard deviation, the actual positioning error is smaller than this value in most cases. However, there is still a small possibility that the positioning error exceeds the value of the alignment error. Therefore, the width of the blind zone 18 and that of the blank zone 20 should preferably be larger than twice of the alignment error. In this embodiment, the width of the blind zone 18 and the width of the blank zone 20 are determined to be 250 $\mu$m and 300 $\mu$m, respectively. These widths are larger than twice of 100 $\mu$m, in order to fully absorb the positioning error of the mask blind. These widths, however, can be appropriately determined depending on the alignment accuracy of the mask blind.

As shown in FIG. 2, the blank zone 20 extends along a substantial length of the bottom side of the pattern forming area 11. Similarly, the blind zone 18 extends along a substantial length of the top side of the TEG pattern region 14, or the boundary between device pattern region 12 and the TEG pattern region 14. In this embodiment the blind zone 18 and the blank zone 20 extend in the horizontal direction along a full length of the TEG pattern region 14. That is, the length (horizontal dimension) of the blind zone 18 and the blank zone 20 is 17.95 mm. Although the length is shorter than the horizontal dimension of the pattern forming area 11 by twice of the width of the scribe line, the length is sufficient to erase or prevent formation of defective patterns during the exposing method that will be explained later. In this sense, the length of the blind zone 18 and the blank zone 20 is substantially equal to the horizontal dimension of the pattern forming area 11.

In FIGS. 1 and 2, the blank zone 20 is represented by a rectangle having a length (horizontal dimension) smaller than that of the pattern forming area 11. On the actual reticle 10, however, the blank zone 20 merges with the scribe line between the TEG pattern region 14 and the chromium thin film 16. In this sense, the blank zone effectively extends along the full length of the bottom side of the pattern forming area 11 of the reticle 10.

In FIGS. 1 and 2, the TEG pattern region 14 is represented by a rectangle. However, this rectangle represents a conceptual region that can be used to arrange TEG patterns and alignment mark patterns for an exposing apparatus. In practice, various patterns with various shapes and dimensions are arranged in the TEG pattern region 14.

Similarly, the device pattern region 12 is conceptually represented by a rectangle in FIG. 1. In this embodiment, the device pattern region 12 is fully occupied with the device chip patterns 13 each having a fixed dimension, except for the area at the bottom-right corner thereof which is provided with the alignment mark pattern 17 for the laser trimming. In order to increase the arrangement density of the device chip patterns 13 within the device pattern region 12, and thereby to increase the number of device chips producible on a wafer, it is preferable to arrange the device chip patterns 13 having a fixed dimension. However, it is also possible to arrange device chip patterns 13 with different dimensions within the device pattern region 12.

The reticle of this invention has the above configuration. The configuration is, however, not limited to the embodiment described above. For example, the TEG pattern region 14 may be disposed along any side of the device pattern region 12, or any side of the pattern forming area 11. Although the width of the TEG pattern region 14 in the above-described embodiment corresponds to two rows of the device chip patterns 13, the width may be arbitrary determined as long as required widths are secured for the blind zone 18 and the blank zone 20.

Figure 3:
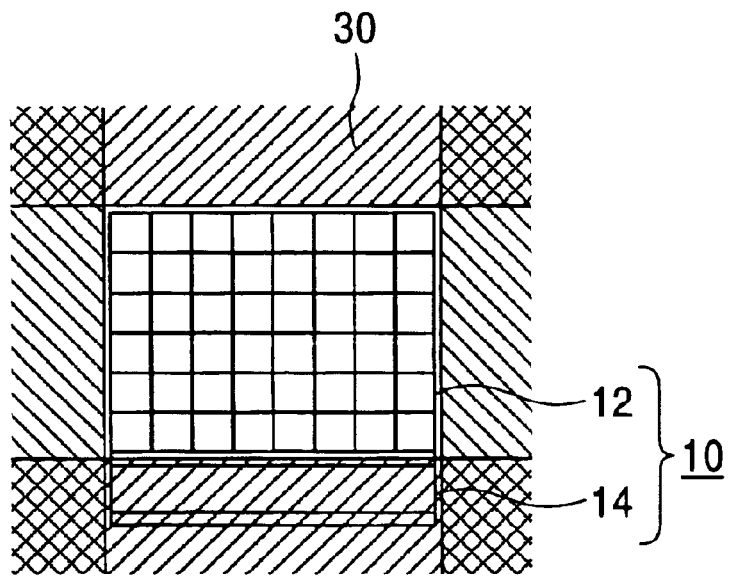
FIG. 3 is a conceptual view of an embodiment of an exposure process in accordance with this invention.
Figure 4:
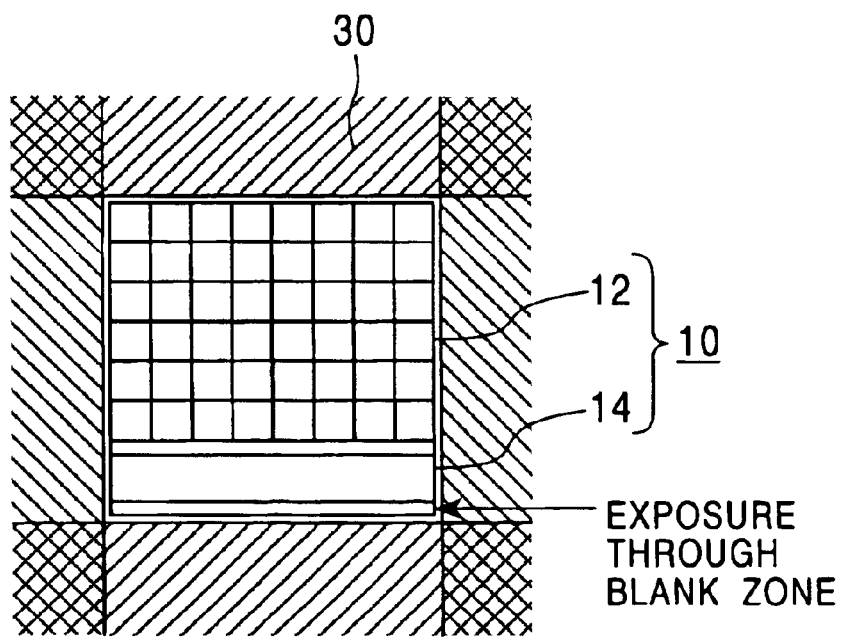
FIG. 4 is a conceptual view of an embodiment of an exposure process in accordance with this invention.
Figure 5A:
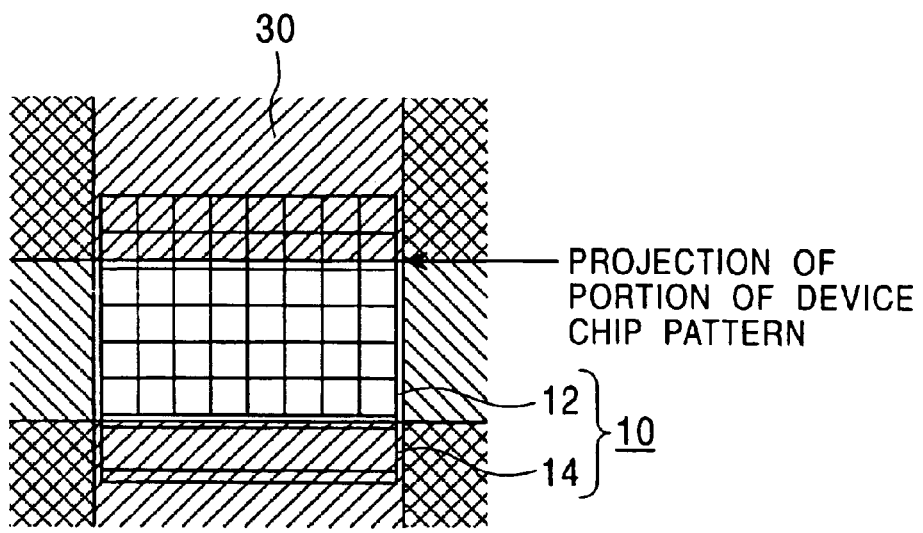
FIGS. 5A and 5B are conceptual views of an embodiment of an exposure process in accordance with this invention.
Figure 5B:
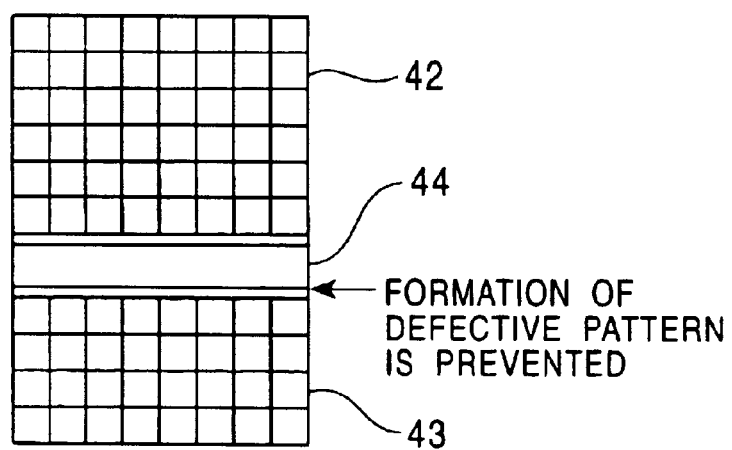
Figure 6A:
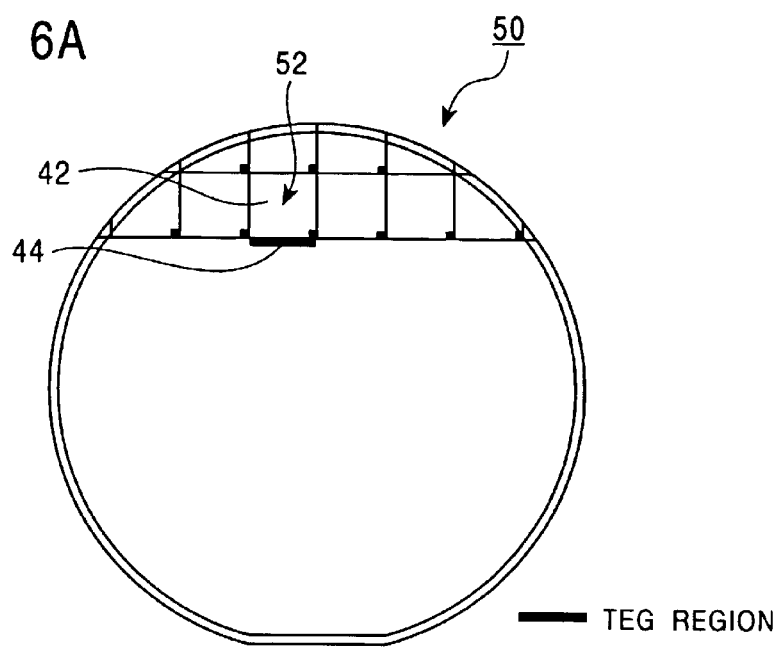
Figure 6B:
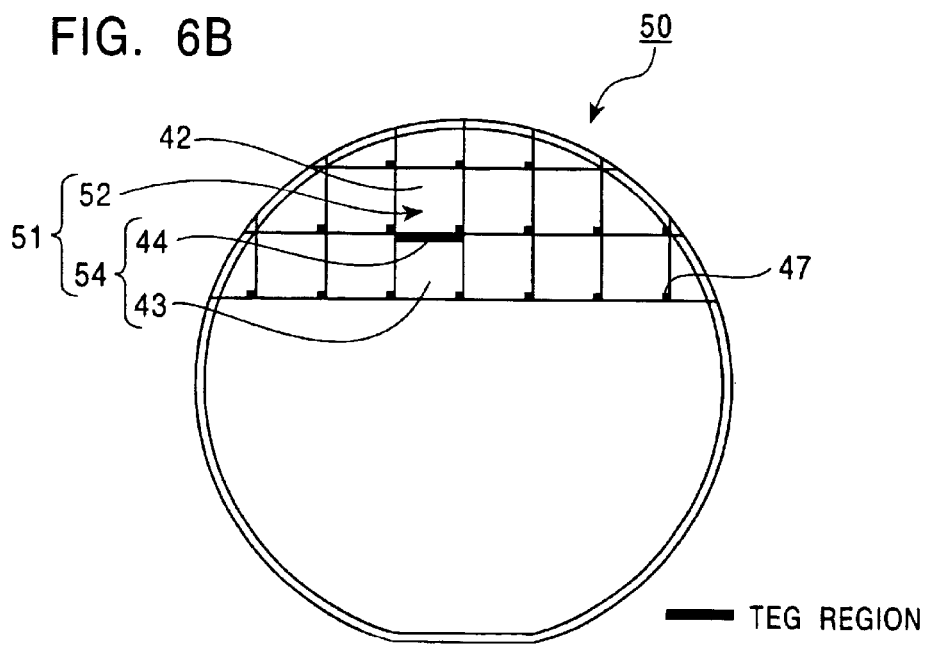

The exposing method of this invention will now be described with reference to FIGS. 3, 4, 5A, 5B, 6A, 6B and 6C. In FIGS. 3, 4, and 5A, the reticle 10 shown in FIGS. 1 and 2 is conceptually depicted. In the following embodiment, as shown in FIGS. 6A and 6B, the semiconductor wafer is exposed from left to right and from top to bottom through the mask pattern on the reticle. Of course, only several points on the semiconductor wafer are exposed through the TEG pattern region.

First, only the device pattern region 12 is repeatedly projected for necessary times. As shown in FIG. 3, the top, right, and left portions of the reticle are covered by the mask blind 30 to project only the device pattern region 12. An upper end of the mask blind for covering the bottom portion of the reticle is aligned within the width of the blind zone 18 of the TEG pattern region 14. In this embodiment, the upper end is aligned substantially in the center of the blind zone so that the alignment error of the mask blind is absorbed.

Next, the device pattern region 12 and the TEG pattern region 14 are simultaneously projected. As shown in FIG. 4, the upper end of the mask blind covering the bottom portion of the reticle is shifted to the region of the chromium film on the periphery of the reticle. In this step, the light passing through the blank zone 20 of the reticle exposes the corresponding position on the semiconductor wafer.

Then, only the device pattern region 12 is repeatedly projected again. In this state, as shown in FIG. 6A, a plurality of exposed areas including only the device regions 42 (first exposed areas 52) are arranged with a fixed pitch in the horizontal direction. A TEG region 44 is also formed by the simultaneous projection of the device pattern region 12 and the TEG pattern region 14. The TEG region 44, thereby, adjoins the bottom of one first exposed area 52.

Next, only the device pattern region 12 is repeatedly projected again, and a portion of the device pattern region 12 is projected at a position adjacent to the position in which both the device pattern region 12 and the TEG pattern region 14 are projected. A shown in FIG. 5A, when only the portion of the device pattern region 12 shown in FIG. 1 is projected, a lower end of the upper mask blind is shifted so as to cover the top two rows of the device chip patterns 13 of the device pattern region 12.

In consideration of the alignment error of the mask blind, the lower end of the mask blind must be further shifted to the upper direction. Otherwise, the mask blind might cover a portion of the third row of the device chip patterns 13, and defective patterns might be formed on the semiconductor water.

Since the alignment error of the mask blind is approximately 100 μm and the width of the scribe line is 50 μm as described above, the lower end of the mask blind covering the upper portion of the reticle must be aligned at a position which is at least 50 μm higher than the lower end of the second row of the device chip patterns. In this case, portions of the device chip patterns in the second row that is not covered by the mask blind is projected onto the semiconductor wafer.

The portion of the device chip pattern is projected, however, to the position on the semiconductor wafer that has been previously exposed with the light passed through the blank zone 20 of the TEG pattern region 14 when the device pattern region 12 and the TEG pattern region 14 are simultaneously projected, as described above. Accordingly, no defective pattern is formed on the semiconductor wafer as shown in FIG. 5B.

As described above, only the device pattern region 12 is repeatedly projected, both the device pattern region 12 and the TEG pattern region 14 are simultaneously projected, and only a portion) of the device pattern region 12 is projected onto a position below the position in which both the device pattern region 12 and the TEG pattern region 14 are simultaneously projected. In the step of projecting only the portion of the device pattern region 12, as shown in FIG. 6B, a portion of the device region 43 is formed below the TEG region 44, shown in FIG. 6A, which is formed by the simultaneous projection of the device pattern region 12 and the TEG pattern region 14. As a result, an exposed area including both the portion of the device region 43 and the TEG region 44 (a second exposed area 54) is formed. This exposed area 54 is also arranged with the same pitches in the vertical and horizontal directions, as for the other exposed areas including only the device regions (first exposed areas 52). In other words, a combination of an exposure step of simultaneously projecting the device pattern region 12 and the TEG pattern region 14 and another exposure step for projecting only a portion of the device pattern region 12 forms two exposed areas 51 including a first exposed area 52 including only the device region 42 and a second exposed area 54 including the portion of the device region 43 and the TEG region 44. That is, two exposure steps form two different exposed areas 52 and 54.

With reference to FIG. 6A, another process may also be employed instead of the simultaneous projection of the device pattern region 12 and the TEG pattern region 14. That is, only the device pattern region 12 is repeatedly projected to form the first exposed areas 52 including the device regions 42, and then only the TEG pattern region 14 is projected to form the TEG region 44. Net a portion of the device pattern region 12 is projected onto a position below the TEG region so that a second exposed area 54 including both the portion of the device region 43 and the TEG region 44 is formed. In this process, three projection steps form two exposed areas 52 and 54.

Further, using the reticle 10, the exposure steps are repeated. Thus, as shown in FIG. 6C, an exposed wafer 50 having a plurality of exposed areas 51 including the first exposed areas 52, each including only the device region 42, and the second exposed areas 54, each including both the portion of the device region 43 and the TEG region 44, is formed. The first and the second exposed areas 52 and 54 are arranged at the fixed pitches in the vertical and horizontal directions on the surface of the exposed wafer 50.

In FIG. 6C, the outer circle indicates the outer edge 59, and the area within the inner circle 58 is the usable area of the exposed wafer 50. In the embodiment shown in FIG. 6C, thirty four (34) exposed areas 51 including twenty nine (29) first exposed areas 52 and five (5) second exposed areas 54 are positioned completely within the usable area. All of these complete exposed areas include respective exposed aligned marks 47 formed by projecting the alignment mark pattern 17 of the reticle 10, as shown in FIG. 1. These alignment marks 47 are positioned at a fixed relative position in respective exposed areas 51, which are arranged vertically and horizontally with fixed pitches. Therefore, these alignment marks 47 are arranged on the exposed wafer 50 in the vertical and horizontal directions with the same fixed pitches as those the exposed areas 51.

Although not show in FIG. 6C, twenty eight rows of exposed device chip patterns are formed in each of the first exposed areas 52 by projecting the device chip pattern 13 of the reticle 10, as shown in FIG. 1. Similarly, twenty six rows of the exposed device chip patterns are formed in each of the second exposed areas 54.

In addition to these thirty four complete exposed areas 51, incomplete exposed areas 56 are also formed on the periphery of the exposed wafer 50, each including at least one exposed device chip pattern. Some of these incomplete exposed areas 56 do not include the exposed alignment mark 47.

Figure 7:
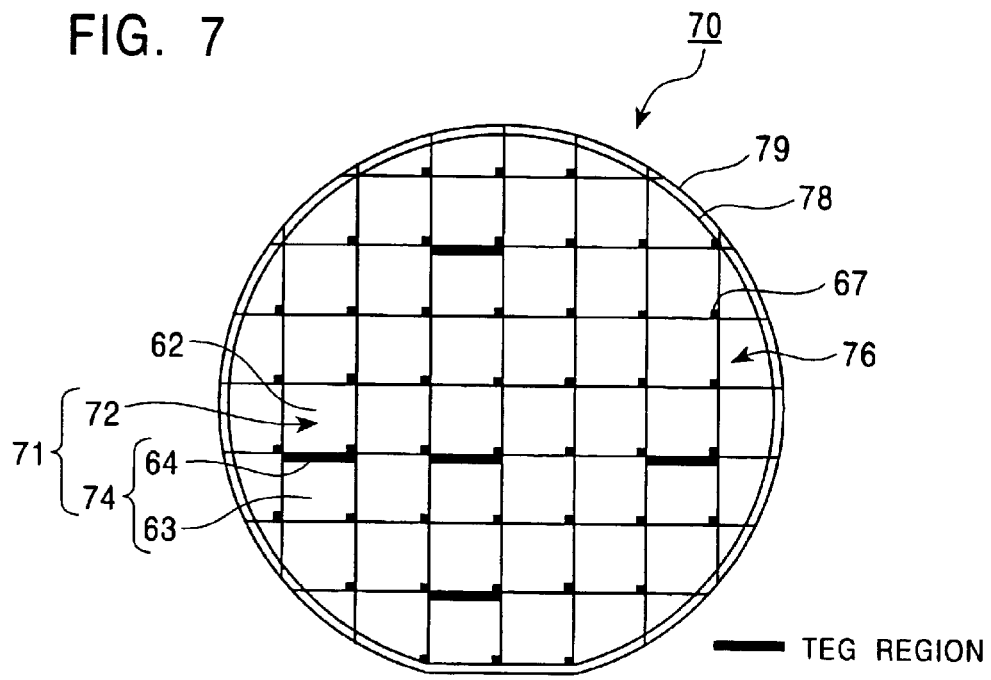
FIG. 7 is a conceptual view of a semiconductor wafer produced by an exposure process in accordance with this invention.

After the exposed areas are formed, the resist pattern is developed and used as, for example, an etching mask. Referring to FIG. 7, by repeating the same process using a plurality of reticles for necessary layers, a semiconductor product wafer 70 having a plurality of patterned areas 71 including first patterned areas 72, each including a patterned device region 62, and second patterned area 74 including a portion of the patterned device region 63 and a patterned TEG region 64, is formed. The first and the second patterned areas 72 and 74 are arranged at the fixed pitches in the vertical and horizontal directions on the surface of the semiconductor product wafer 70. A plurality of produced device chips (not shown) is arranged in each of the patterned device regions 62 and 63.

Similar to the case of the exposed wafer 50 shown in FIG. 6C, the product wafer 70 shown in FIG. 7 includes thirty-four complete patterned areas 71. The alignment marks 67 in these complete patterned areas 71 are arranged in vertical and horizontal directions with the fixed pitches. Therefore, the alignment in the laser-trimming step can be made easily. In practice, for example, electrical characteristics of the produced device chips are first measured by a probe and the device chips that are necessary to be trimmed are selected. A laser beam is directed to fuse in the selected device chips to trim, i.e., to adjust the electrical characteristics of, the selected device chips by using the alignment marks 67 as positional references. The regular arrangement of the patterned areas 71 with the fixed pitches is also beneficial to ease the probing.

The product wafer 70 also includes incomplete patterned areas 76 on the periphery of the wafer. Some of the incomplete patterned areas 76 do not include an alignment mark 67. Nonetheless, it is also possible to trim the produced device chips in these incomplete patterned areas 76, because the alignment can be made using selected ones of the alignment marks 67 produced in the complete patterned areas 71. In practice, all the produce device chips located within the usable area 78 including ones in the incomplete patterned areas 76 are probed, and selected ones of the probed chips are trimmed. Therefore, the number of total device chips that can be produced on a wafer can be increased.

The TEG regions 64 are formed at the tops of the second patterned areas 74, which are arranged with multiples of the fixed pitches in the vertical and horizontal directions. Such a regular arrangement facilitates the measurement of electrical characteristics of TEGs produced in the TEG regions.

The number and positions of the TEG regions 64 are determined so that an exposing apparatus can align the wafer with a sufficient precision using the alignment marks formed in the TEG regions. The alignment marks for the exposing apparatus, which are formed at a fixed relative position within respective TEG region, are also arranged with multiples of the fixed pitches. The regular arrangement of the alignment marks also facilitates the alignment. If a trimming apparatus that can aligned the product wafer 70 using alignment marks formed in the TEG regions 64 is used, it is possible to also form the alignment marks for the trimming in the TEG regions 64. By forming the alignment marks for the trimming in the TEG pattern regions 64, the number of producible semiconductor device chips on a wafer can be further increased by utilizing the entire device regions to form the device chips.

Figure 8:
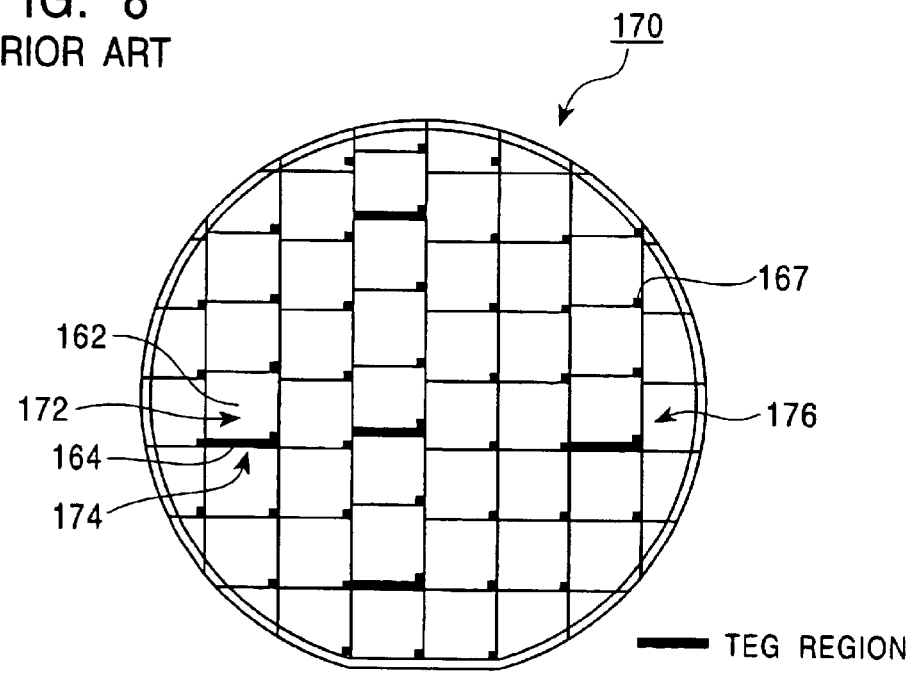
FIG. 8 is a conceptual view of a semiconductor wafer produced by a conventional exposure process.

FIG. 8 shows an example of a semiconductor product wafer 170 produced by a conventional exposing process, i.e., a reticle having a device pattern region and a TEG pattern region is prepared and either the whole device pattern region, or the TEG pattern region, is repeatedly exposed on the wafer using mask blinds of an exposing apparatus. The product wafer 170 includes first patterned areas 172 each including a patterned device region 162 and second patterned areas 174 each including a patterned TEG region 164. The second patterned areas 174 are formed at only five points on the wafer 170. As shown in FIG. 8, the patterned TEG regions 164 are not aligned in the horizontal direction. A complicated treatment is needed to measure TEGs in such irregularly arranged TEG regions 164. Further, the vertical pitches of the first patterned areas 172, and those of the alignment marks 167 in these first patterned areas 172 are not constant. Therefore, the laser-trimming step also requires complicated procedures. Some of the produced device chips on the periphery of the wafer 170 cannot be trimmed. Therefore, the number of device chips that can be produced on a wafer is reduced as compared to embodiments of this invention.

When the exposure process in accordance with this embodiment of this invention is performed using a stepper, a wafer stage is moved at predetermined pitches corresponding to the pitches of the exposed areas on the semiconductor wafer. Thus, this process does not require complicated operations. In this embodiment, only five TEG regions are formed on the semiconductor wafer, contributing to a significant increase in the number of device chips producible on one semiconductor wafer.

The order of exposure and the number of the TEG regions on the semiconductor wafer may be changed in this invention.

Another process, which is the reverse of the above process, may also be employed. That is, in this other process, first, only a portion of the device pattern region 12 is projected onto a first position and then the device pattern region 12 and the TEG pattern region 14 are simultaneously projected onto a second position adjoining the first position.

Although ultra-violet light is widely used for the exposure method, other radiation sources such as extreme ultra-violet light, X-ray, and electron beam can also be used in the exposure method of this invention. When, for example, extreme ultra-violet light is used, a reticle of this invention can be produced with patterns of an absorber film on a surface of a substrate of a reflective mirror. In such case, the wafer is exposed with the radiation reflected through the reflective reticle.

Although a laser beam is widely used for the trimming process, other energy beams such as electron beam and an ion beam can also be used.

Any modification and variation of this invention are available within the scope of this invention, in addition to the above-described embodiments.

The exposing process of this invention is applicable to a case using a step-and-repeat exposing apparatus and to a case using step-and-scan apparatus.

As described above, the blank zone is provided in the TEG pattern region on the reticle of this invention. Thus, a shot layout of constant step pitches can be realized even when the number of TEG regions on the wafer is limited. As a result, the number of semiconductor device chips producible on one semiconductor wafer is increased. Evaluation of electrical characteristics of TEGs and device chips and laser trimming of the device chips can be performed efficiently as in the case that TEGs are formed in scribe lines. No complicated process that decreases throughput is required. Moreover, substantially all device chips including those formed on the periphery of wafers can be trimmed and utilized as semiconductor product chips. Thus, the number of product device chips producible on one wafer is further increased.

What is claimed is:

1. A semiconductor product wafer, comprising:
a plurality of patterned areas arranged vertically and horizontally with fixed pitches on a surface of the wafer, the patterned areas including a plurality of first patterned areas each including a device region and at least one second patterned area including a portion of the device region and a Test Element Group (TEG) region.

2. The semiconductor product wafer according to claim 1, wherein the device region in each of the first patterned areas includes a predetermined number of rows of device chips, and the portion of the device region of the second patterned area includes a number of rows of the device chips that is less than the predetermined number of rows of the device chips.

3. The semiconductor product wafer according to claim 2, wherein a width of a scribe line between the rows of the semiconductor device chips is the same as that of a scribe line between the TEG region and an adjacent one of the rows of the device chips in the second patterned area.

4. The semiconductor product wafer according to claim 1, wherein the TEG region is smaller than the portion of the device region.

* * * * *